United States Patent
Son

(10) Patent No.: US 8,698,125 B2
(45) Date of Patent: Apr. 15, 2014

(54) LIGHT EMITTING DEVICE INCLUDING SECOND CONDUCTIVE TYPE SEMICONDUCTOR LAYER AND METHOD OF MANUFACTURING THE LIGHT EMITTING DEVICE

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 357 days.

(21) Appl. No.: 12/916,740

(22) Filed: Nov. 1, 2010

(65) Prior Publication Data

US 2011/0101340 A1 May 5, 2011

(30) Foreign Application Priority Data

Nov. 2, 2009 (KR) .................. 10-2009-0104956

(51) Int. Cl.
*H01L 29/06* (2006.01)
*H01L 31/00* (2006.01)
*H01L 33/22* (2010.01)

(52) U.S. Cl.
CPC ..................... *H01L 33/22* (2013.01)
USPC .............................. 257/14; 257/43

(58) Field of Classification Search
CPC ........................................... H01L 33/22
USPC ................ 257/14, 43, E33.007, E33.008
See application file for complete search history.

(56) References Cited

U.S. PATENT DOCUMENTS

| 2004/0113167 A1 | 6/2004 | Bader et al. | |
| 2005/0135453 A1* | 6/2005 | Kneissl et al. | 372/94 |
| 2005/0285128 A1* | 12/2005 | Scherer et al. | 257/98 |
| 2007/0029541 A1 | 2/2007 | Xin et al. | |
| 2007/0057249 A1* | 3/2007 | Kim et al. | 257/14 |
| 2007/0065959 A1 | 3/2007 | Chang et al. | |
| 2008/0029758 A1 | 2/2008 | Kozaki | |
| 2009/0086785 A1* | 4/2009 | Hatori et al. | 372/50.11 |
| 2009/0137072 A1* | 5/2009 | Erchak et al. | 438/26 |
| 2009/0189154 A1* | 7/2009 | Lu et al. | 257/43 |
| 2010/0038662 A1* | 2/2010 | Fushimi et al. | 257/98 |

FOREIGN PATENT DOCUMENTS

| EP | 1734592 A2 | 12/2006 |
| JP | 2007-88404 A | 4/2007 |
| JP | 2007-95745 A | 4/2007 |
| JP | 2007-266401 A | 10/2007 |
| JP | 2008-34754 A | 2/2008 |
| KR | 10-1998-014878 A | 5/1998 |
| KR | 10-2005-0100485 A | 10/2005 |
| KR | 10-2005-0123028 A | 12/2005 |
| KR | 10-2007-0015709 A | 2/2007 |
| KR | 10-2009-0085877 A | 8/2009 |
| WO | WO 2008/153065 A1 | 12/2008 |

\* cited by examiner

*Primary Examiner* — Phat X Cao

(74) *Attorney, Agent, or Firm* — Birch, Stewart, Kolasch & Birch, LLP

(57) ABSTRACT

Provided is a light emitting device, which includes a first conductive type semiconductor layer, an active layer, a roughness pattern, and a second conductive type semiconductor layer. The active layer is disposed on the first conductive type semiconductor layer. The roughness pattern is disposed on the active layer. The second conductive type semiconductor layer is disposed on the roughness pattern and the active layer, and includes a metal oxide.

20 Claims, 6 Drawing Sheets

FIG. 1
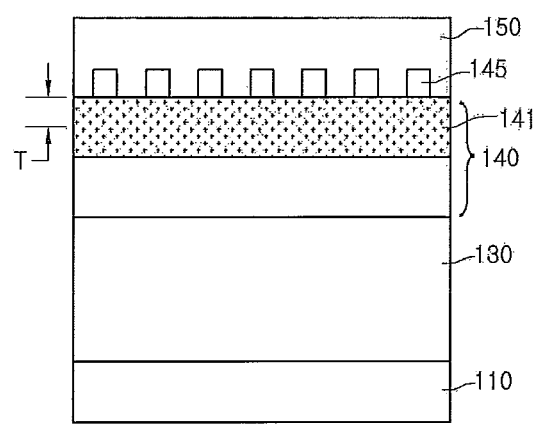
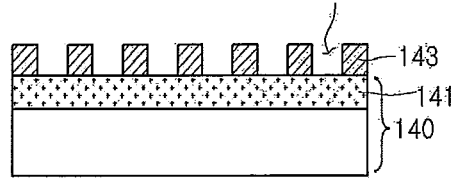
FIG. 2
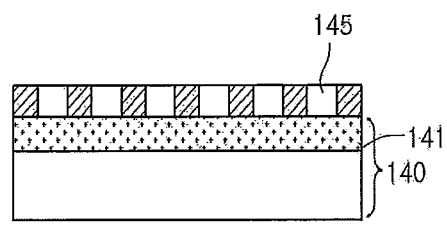
FIG. 3

FIG. 4
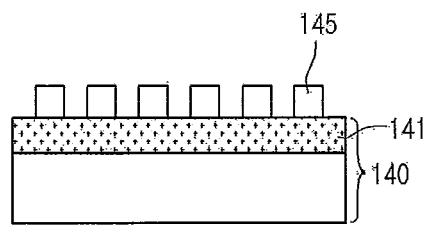
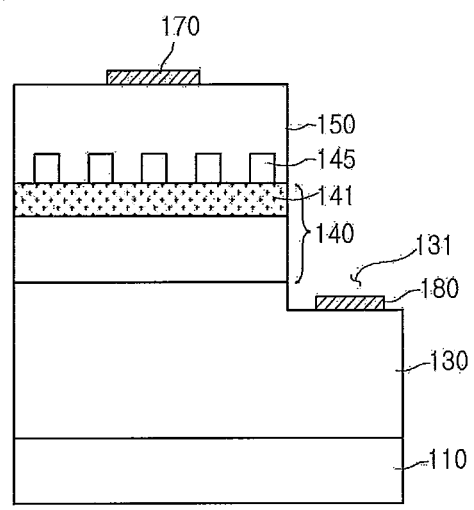
FIG. 5
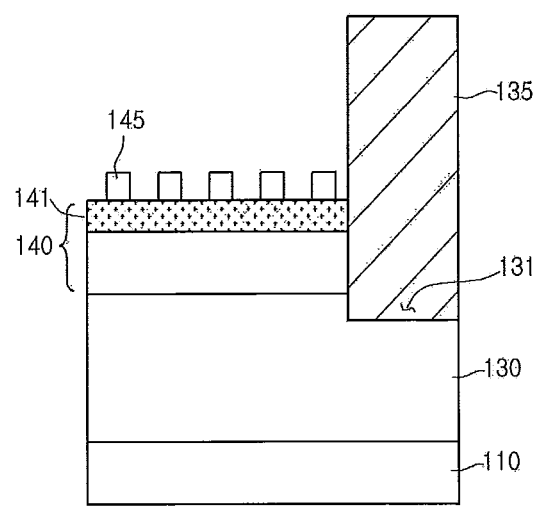
FIG. 6

100B

LIGHT EMITTING DEVICE INCLUDING SECOND CONDUCTIVE TYPE SEMICONDUCTOR LAYER AND METHOD OF MANUFACTURING THE LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2009-0104956 (filed on Nov. 2, 2009), which is hereby incorporated by reference in its entirety.

BACKGROUND

Embodiments relate to a light emitting device and a method of manufacturing the light emitting device.

Light emitting diodes (LEDs) are semiconductor light emitting devices that convert an electric current into light. Recently, as the brightness of light emitting diodes is gradually improved, the light emitting diodes are widely used as light sources for displays, vehicles, and lighting devices. Furthermore, phosphors are used or light emitting diodes of various colors are combined to form a light emitting diode that emits efficient white light.

The wavelength of light emitted from a light emitting diode depends on a semiconductor material constituting the light emitting diode. This is because the wavelength of the emitted light is determined according to an energy band of an active layer of the light emitting diode, that is, according to a band gap that refers to the energy difference between the top of a valence band and the bottom of a conduction band.

The brightness of a light emitting diode depends on various conditions including the structure of an active layer, an optical extraction structure for effectively extracting light to the outside, the size of a chip, and the type of a molding member enveloping a light emitting diode. In this case, when the structure of an active layer is improved, an internal quantum efficiency of a light emitting diode is enhanced, thereby fundamentally improving the brightness of the light emitting diode.

SUMMARY

Embodiments provide a light emitting device having improved reliability and a method of manufacturing the light emitting device.

Embodiments provide a light emitting device and a method of manufacturing the light emitting device, which minimizes optical loss.

Embodiments provide a light emitting device having a wide operation voltage range and a method of manufacturing the light emitting device.

Embodiments provide a light emitting device having a small amount of impurities, and a method of manufacturing the light emitting device.

In one embodiment, a light emitting device includes: a first conductive type semiconductor layer: an active layer on the first conductive type semiconductor layer; a roughness pattern on the active layer; and a second conductive type semiconductor layer on the roughness pattern and the active layer, the second conductive type semiconductor layer including a metal oxide.

The details of one or more embodiments are set forth in the accompanying drawings and the description below. Other features will be apparent from the description and drawings, and from the claims.

BRIEF DESCRIPTION OF THE DRAWINGS

FIG. 1 is a cross-sectional view illustrating a light emitting device according to an embodiment.

FIGS. 2 to 4 are cross-sectional views illustrating a method of manufacturing the light emitting device of FIG. 1.

FIG. 5 is a cross-sectional view illustrating a horizontal light emitting device including the light emitting device of FIG. 1.

FIGS. 6 and 7 are cross-sectional views illustrating a method of manufacturing the horizontal light emitting device of FIG. 5.

DETAILED DESCRIPTION OF THE EMBODIMENTS

Figure 7:
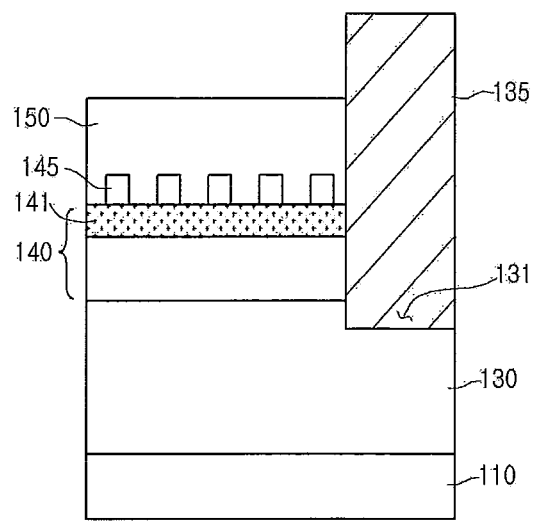

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a method of manufacturing the same according to embodiments will be described with reference to the accompanying drawings.

FIG. 1 is a cross-sectional view illustrating a light emitting device 100 according to an embodiment.

Referring to FIG. 1, the light emitting device 100 may include a substrate 110, a first conductive type semiconductor layer 130, an active layer 140, and a second conductive type semiconductor layer 150, a second electrode (not shown), and a first electrode (not shown).

The substrate 110 may be formed of at least one of sapphire ($Al_2O_3$), SiC, Si, GaAs, GaN, ZnO, Si, GaP, InP, and Ge.

The first conductive type semiconductor layer 130 may be disposed on the substrate 110. For example, the first conductive type semiconductor layer 130 may include an n type semiconductor layer. The n type semiconductor layer may be formed of a semiconductor material having a composition formula of $In_xAl_yGa_{1-x-y}N$, ($0 \leq x \leq 1$, $0 \leq y \leq 1$, $0 \leq x+y \leq 1$) such as InAlGaN, GaN, AlGaN, InGaN, AlN, AlInN, or InN, and is doped with an n type dopant such as Si, Ge, or Sn.

A buffer layer (not shown) may be disposed between the substrate 110 and the first conductive type semiconductor layer 130. The buffer layer (not shown) may be disposed to reduce a lattice constant difference between the substrate 110 and the first conductive type semiconductor layer 130, and may be formed of one of GaN, AlN, AlGaN, InGaN, and AlInGaN.

A semiconductor layer (not shown) may be disposed between the buffer layer (not shown) and the first conductive type semiconductor layer 130. For example, the semiconductor layer (not shown) may be an undoped GaN layer, but the present disclosure is not limited thereto.

Alternatively, at least one of the buffer layer (not shown) and the semiconductor layer (not shown) that is not conductive may be removed.

The active layer 140 may be disposed on the first conductive type semiconductor layer 130.

In the active layer 140, electrons (or holes) injected through the first conductive type semiconductor layer 130 meet holes (or electrons) injected through the second conductive type semiconductor layer 150 to be formed later, to emit light by a band gap of an energy band according to the material of the active layer 140.

The active layer 140 may have a single quantum well structure or a multi quantum well (MQW) structure, but the present disclosure is not limited thereto.

In the current embodiment, the active layer 140 has a multi quantum well structure.

The active layer 140 may include a plurality of barrier layers, and a plurality of well layers may be stacked between the barrier layers. The well layers may have a composition formula of $In_{x1}Al_{y1}Ga_{1-x1-y1}N$ (0≤x1≤1, 0≤y1≤1, 0≤x1+y1≤1), and the barrier layers may have a composition formula of $In_{x2}Al_{y2}Ga_{1-x2-y2}N$ (0≤x2≤1, 0≤y2≤1, 0≤x2+y2≤1), in which x1>x2.

A first barrier layer 141 that is the upper most one of the barrier layers may have a thickness, e.g., ranging from about 150% to about 250% of that of the other barrier layers. Particularly, the first barrier layer 141 may have a thickness of about 200% of that of the other barrier layers.

An upper portion of the first barrier layer 141 corresponding to a first thickness T may be doped with a p type dopant such as Mg, Ca, Sr, Ba, or Cd. The first thickness T may have a thickness, e.g., ranging from about 20% to about 30% of the entire thickness of the first barrier layer 141. Particularly, the first thickness T may have a thickness of about 25% thereof.

Since the first barrier layer 141 is thicker than the other barrier layers, the p type dopant is prevented from invading into the active layer 140 even when the portion having the first thickness T is doped, thereby ensuring the reliability of the light emitting device 100.

The buffer layer (not shown), the non-conductive semiconductor layer (not shown), the first conductive type semiconductor layer 130, and the active layer 140 may be formed using a metal organic chemical vapor deposition (MOCVD) method, or a method such as chemical vapor deposition (CVD), molecular beam epitaxy (MBE), sputtering, or hydride vapor phase epitaxy (HVPE), but the present disclosure is not limited thereto.

A roughness pattern 145 is disposed on the first barrier layer 141. The roughness pattern 145 may be formed of a semiconductor material having a composition formula of $In_xAl_yGa_{1-x-y}N$ (0≤x≤1, 0≤y≤1, 0≤x+y≤1), such as one of InAlGaN, GaN, AlGaN, InGaN, AlN, and InN.

The roughness pattern 145 may be doped with a p type dopant such as Mg, Ca, Sr, Ba, and Cd, and thus, may have the nature of a p type semiconductor.

The roughness pattern 145 improves an extraction efficiency of light emitted from the active layer 140 and increases interface coupling force between the active layer 140 and the second conductive type semiconductor layer 150 to securely couple and fix the second conductive type semiconductor layer 150 to the active layer 140.

Hereinafter, a method of manufacturing the roughness pattern 145 will now be described with reference to FIGS. 2 to 4.

Referring to FIG. 2, a magnesium nitride (MgN) layer 143 is formed on a surface of the first barrier layer 141. The magnesium nitride (MgN) layer 143 may be grown for about 3 minutes to about 10 minutes, particularly, for about 5 minutes, to have a porous surface with a pattern 144. Thus, the first barrier layer 141 may be exposed through the pattern 144.

Referring to FIG. 3, the roughness pattern 145 may be grown within the pattern 144 of the magnesium nitride (MgN) layer 143. The roughness pattern 145 may be formed using a method such as metal organic chemical vapor deposition (MOCVD), chemical vapor deposition (CVD), molecular beam epitaxy (MBE), sputtering, and hydride vapor phase epitaxy (HVPE), but the present disclosure is not limited thereto.

Referring to FIG. 4, the magnesium nitride (MgN) layer 143 is removed. The magnesium nitride (MgN) layer 143 may be removed through a thermochemical annealing process using ammonia ($NH_3$) and hydrogen ($H_2$) for about 5 minutes, but the present disclosure is not limited thereto.

Accordingly, the roughness pattern 145 may be provided. The roughness pattern 145 improves the extraction efficiency of light emitted from the active layer 140 and increases the interface coupling force between the active layer 140 and the second conductive type semiconductor layer 150 to securely couple and fix the second conductive type semiconductor layer 150 to the active layer 140.

Referring to FIG. 1, the second conductive type semiconductor layer 150 is disposed on the first barrier layer 141 and the roughness pattern 145.

The second conductive type semiconductor layer 150 may be formed by growing a metal oxide having electrical conductivity characteristics, such as a zinc oxide (ZnO). The second conductive type semiconductor layer 150 includes a p type dopant such as Mg, Ca, Sr, Ba, and Cd.

The second conductive type semiconductor layer 150 may be grown using a method such as metal organic chemical vapor deposition (MOCVD), chemical vapor deposition (CVD), plasma-enhanced chemical vapor deposition (PECVD), hydride vapor phase epitaxy (HVPE), sputtering, and pulse laser deposition (PLD). Alternatively, the second conductive type semiconductor layer 150 may be formed using molecular beam epitaxy (MBE).

The second conductive type semiconductor layer 150 is grown at a higher pressure using the molecular beam epitaxy (MBE) than using other methods, so as to decrease the amount of introduced impurities. In the current embodiment, the second conductive type semiconductor layer 150 is grown using the molecular beam epitaxy (MBE), but the present disclosure is not limited thereto.

For example, in the molecular beam epitaxy (MBE), a zinc (Zn) source, a magnesium (Mg) source, and a cadmium (Cd) source are injected in a solid state into a chamber, and are heated and melted, and then, oxygen ($O_2$) gas is provided to the chamber, and the sources are deposited on the active layer 140 and the roughness pattern 145 to grow the second conductive type semiconductor layer 150. However, the zinc (Zn), magnesium (Mg), or cadmium (Cd) source may be injected in a gas or liquid state, but the present disclosure is not limited thereto.

At this point, the zinc (Zn) may react with the oxygen ($O_2$) to form a zinc oxide (ZnO) thin film, and the magnesium (Mg) and the cadmium (Cd) may be uniformly distributed as p type dopants on the zinc oxide (ZnO) thin film, that is, on the second conductive type semiconductor layer 150. When the p type dopants are uniformly distributed on the second conductive type semiconductor layer 150, a resistance distribution of the second conductive type semiconductor layer 150 can be uniformly formed to improve current characteristics of the second conductive type semiconductor layer 150. In addition, even when an element having a large atomic size is provided as the p type dopant, optical loss of the light emitting device 100 can be minimized.

A concave-convex pattern may be formed on a surface of the second conductive type semiconductor layer 150 to improve the light extraction efficiency. Since the zinc oxide has excellent crystalline characteristics, even when the second conductive type semiconductor layer 150 has the concave-convex pattern, defects due to cracks or breaks can be reduced.

Since the second conductive type semiconductor layer 150 is formed by growing the zinc oxide (ZnO) using the molecular beam epitaxy (MBE), the second conductive type semiconductor layer 150 may be low in the amount of impurities, defects, and the degree of dislocation. Thus, the optical loss generated when light emitted from the active layer 140 passes through the second conductive type semiconductor layer 150 can be minimized, and the light emitting device 100 can have improved current characteristics.

In addition, since the second conductive type semiconductor layer 150 is formed by growing the zinc oxide (ZnO), the concentration of the p type dopants such as Mg and Cd implanted to the zinc oxide (ZnO) is controlled to adjust an operation voltage of the light emitting device 100 in a wide range from about 2.8 eV to about 4.5 eV and improve electrostatic discharge (ESD) characteristics.

The second conductive type semiconductor layer 150 may be doped with an n type dopant, and the first conductive type semiconductor layer 130 may be doped with a p type dopant. Although not shown, a third conductive type semiconductor layer (not shown) may be disposed on the second conductive type semiconductor layer 150. Thus, the light emitting device 100 may have a bonding structure with one of pn, np, pnp, and npn, but the present disclosure is not limited thereto.

<Horizontal Light Emitting Device 100A>

FIG. 5 is a cross-sectional view illustrating a horizontal light emitting device 100A including the light emitting device 100 of FIG. 1.

To form the horizontal light emitting device 100A, a mesa etching process is performed on the light emitting device 100 of FIG. 1 to expose a portion of the first conductive type semiconductor layer 130, and a first electrode 180 may be formed on the exposed portion.

A second electrode 170 may be disposed on the second conductive type semiconductor layer 150. Since the second conductive type semiconductor layer 150 also function as a transparent electrode, an additional transparent electrode layer or a reflective electrode layer for an ohmic contact may be unnecessary. Thus, optical loss due to the additional transparent electrode layer or reflective electrode layer can be prevented to improve a light emitting efficiency of the horizontal light emitting device 100A.

A transparent electrode layer or reflective electrode layer may be disposed between the second conductive type semiconductor layer 150 and the second electrode 170, but the present disclosure is not limited thereto.

Hereinafter, a method of manufacturing the horizontal light emitting device 100A will now be described with reference to FIGS. 6 to 7.

Referring to FIG. 6, the mesa etching process is performed on the light emitting device 100 before forming the second conductive type semiconductor layer 150 to form a mesa etching part 131 exposing a portion of the first conductive type semiconductor layer 130. A mask 135 is formed on the mesa etching part 131.

The mask 135 may be formed of a metal or photoresist, in which the metal may be chrome (Cr), nickel (Ni), or stannum (Sn), but the present disclosure is not limited thereto.

Referring to FIG. 7, the second conductive type semiconductor layer 150 is formed on the first barrier layer 141 and the roughness pattern 145.

By forming the mask 135, a growth area of the second conductive type semiconductor layer 150 is decreased, and an etching process or breaking process on the second conductive type semiconductor layer 150 is unnecessary, so that, the horizontal light emitting device 100A can be provided without damaging the second conductive type semiconductor layer 150.

Referring to FIGS. 5 and 7, the second electrode 170 may be formed on the second conductive type semiconductor layer 150.

Since the second conductive type semiconductor layer 150 also function as a transparent electrode, an additional transparent electrode layer or a reflective electrode layer for an ohmic contact may be unnecessary.

A transparent electrode layer or reflective electrode layer may be disposed between the second conductive type semiconductor layer 150 and the second electrode 170.

The transparent electrode layer includes at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, but the present disclosure is not limited thereto. The reflective electrode layer may be formed of a material having high reflectivity, which includes at least one of silver (Ag), an alloy including silver (Ag), aluminum (Al), and an alloy including aluminum (Al).

Then, the mask 135 is removed, and the first electrode 180 can be formed on the exposed first conductive type semiconductor layer 130.

The mask 135 may be removed through an etching process, but the present disclosure is not limited thereto.

Furthermore, the present disclosure is not limited to the method of manufacturing the horizontal light emitting device 100A.

<Vertical Light Emitting Device 100B>

Figure 8:
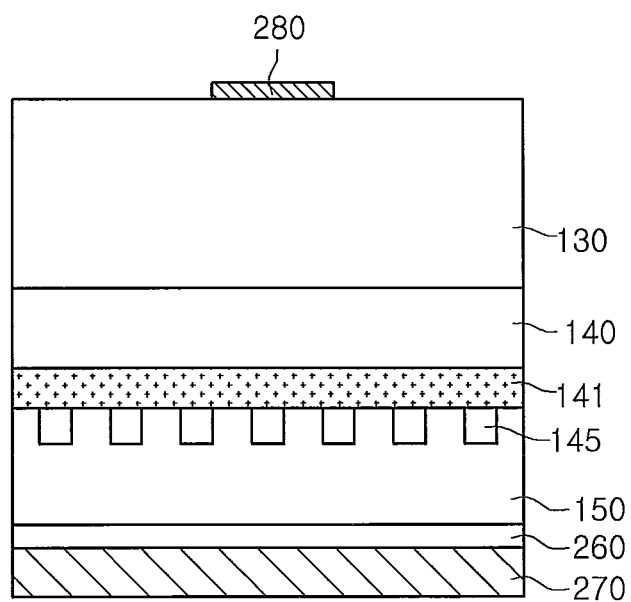
FIG. 8 is a cross-sectional view illustrating a vertical light emitting device including the light emitting device of FIG. 1.

FIG. 8 is a cross-sectional view illustrating a vertical light emitting device 100B including the light emitting device 100 of FIG. 1.

The vertical light emitting device 100B is the reversed light emitting device 100 of FIG. 1, and thus, the manufacturing order is the same.

Referring to FIG. 8, the vertical light emitting device 100B includes a reflective layer 260 and a conductive support member 270 below the second conductive type semiconductor layer 150 of the light emitting device 100 of FIG. 1, and the substrate 110 is removed.

The reflective layer 260 may be disposed below the second conductive type semiconductor layer 150.

The reflective layer 260 may be formed of a material having high reflectivity, which includes at least one of silver (Ag), an alloy including silver (Ag), aluminum (Al), an alloy including aluminum (Al), platinum (Pt), and an alloy including platinum (Pt).

The conductive support member 270 may be disposed below the reflective layer 260. The conductive support member 270 supplies power to the vertical light emitting device 100B.

The conductive support member 270 may be formed of at least one of titanium (Ti), chrome (Cr), nickel (Ni), aluminum (Al), platinum (Pt), gold (Au), tungsten (W), copper (Cu), molybdenum (Mo), and a semiconductor substrate doped with impurities.

A bonding layer (not shown) may be disposed between the conductive support member 270 and the reflective layer 260 to improve the interface coupling force thereof. An ohmic layer (not shown) may be disposed between the second conductive type semiconductor layer 150 and the reflective layer 260 for an ohmic contact therebetween.

The substrate 110 may be removed through a laser lift off (LLO) process or an etching process, but the present disclosure is not limited thereto.

After the substrate 110 is removed, the buffer layer (not shown), the non-conductive semiconductor layer (not shown), and a portion of the first conductive type semiconductor layer 130 may be removed through an etching process such as inductively coupled plasma/reactive ion etching (ICP/RIE), but the present disclosure is not limited thereto.

After the substrate 110 is removed, the first conductive type semiconductor layer 130, the buffer layer (not shown), and the non-conductive semiconductor layer (not shown) are exposed, and a second electrode 280 may be disposed on one of the first conductive type semiconductor layer 130, the buffer layer (not shown), and the non-conductive semiconductor layer (not shown). The second electrode 280 and the conductive support member 270 supply power to the vertical light emitting device 100B.

The above-described light emitting device according to the embodiment may be applied to a light emitting device package.

Hereinafter, a light emitting device package according to an embodiment will be described with reference to FIGS. 9 and 10.

Figure 9:
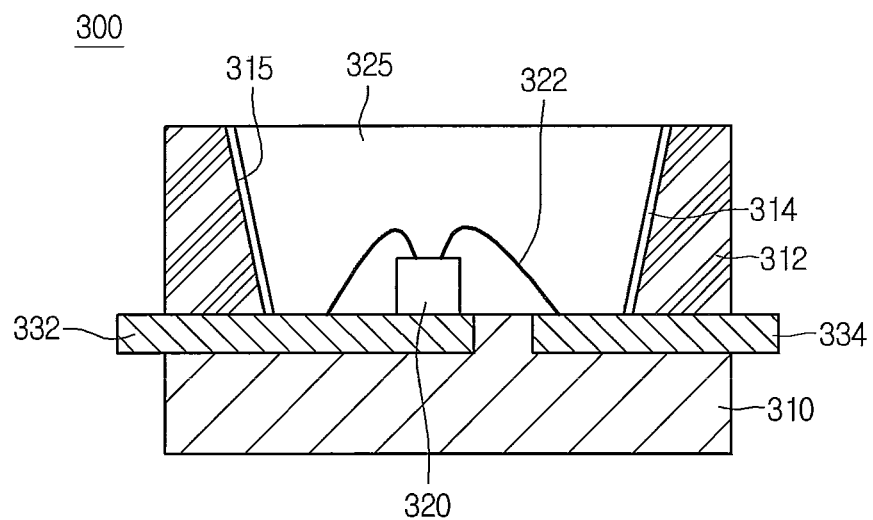
FIG. 9 is a cross-sectional view illustrating a light emitting device package including the horizontal light emitting device of FIG. 5.

FIG. 9 is a cross-sectional view illustrating a light emitting device package including the horizontal light emitting device 100 of FIG. 5.

Referring to FIG. 9, a light emitting device package 300 includes a body 310 having a cavity 315, a light emitting device 320, a resin 325, first and second conductive members 332 and 334, and a reflective layer 314 disposed on an inner wall of the cavity 315.

The body 310 may be formed of one of polyphthalamide (PPA), liquid crystal polymer (LCP), syndiotactic polystyrene (SPS), and ceramics through injection molding, but the present disclosure is not limited thereto. The cavity 315, which has a cup shape, is formed through a predetermined depth in an upper part 312 of the body 310. A side surface of the cavity 315 may be inclined at a predetermined angle from a perpendicular axis to the bottom surface thereof.

The first and second conductive members 332 and 334 are horizontally disposed in the body 310.

The first and second conductive members 332 and 334 are exposed to the cavity 315, and are electrically insulated from each other. Ends of the first and second conductive members 332 and 334 are exposed to the outside to function as electrodes. Surfaces of the first and second conductive members 332 and 334 may be coated with a reflective material.

The first conductive member 332 may be coupled to the light emitting device 320 through die bonding. The light emitting device 320 may be the horizontal light emitting device 100A exemplified in FIG. 5, and the second electrode 170 and the first electrode 180 of FIG. 5 may be connected through wires 322 to the first and second conductive members 332 and 334.

The light emitting device 320 may be at least one of color light emitting diodes such as a red light emitting diode, a green light emitting diode, and a blue light emitting diode, or at least one ultraviolet (UV) light emitting diode.

The reflective layer 314 is disposed on the side surface of the cavity 315, and the resin 325 is disposed within the cavity 315. The resin 325 may include transparent silicon or epoxy, or a phosphor.

A lens (not shown) may be disposed on the resin 325. The first and second conductive members 332 and 334 may be electrically connected to a protective device such as a Zener diode (not shown) to protect the light emitting device 320.

Figure 10:
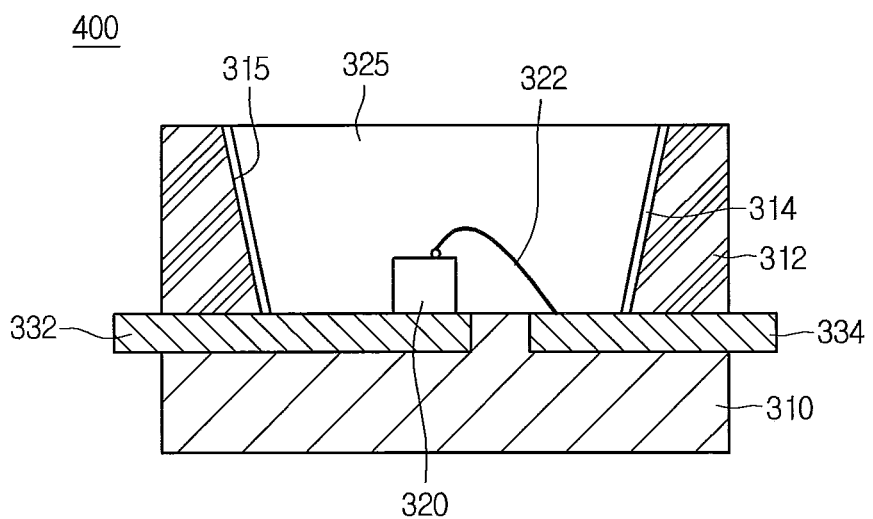
FIG. 10 is a cross-sectional view illustrating a light emitting device package including the vertical light emitting device of FIG. 8.

FIG. 10 is a cross-sectional view illustrating a light emitting device package including the vertical light emitting device of FIG. 8.

Referring to FIG. 10, a light emitting device package 400 is connected to the second conductive member 334 through just one of the wires 322.

The light emitting device package 400 includes the body 310 having the cavity 315 in the upper part 312, the first and second conductive members 332 and 334, the light emitting device 320 electrically connected to the first and second conductive members 332 and 334, and the resin 325 disposed within the cavity 315.

The body 310 may be formed of one of silicon, ceramic, and resin as described above. For example, the body 310 may be formed of at least one of silicon, silicon carbide (SiC), aluminum nitride (AlN), polyphthalamide (PPA), and liquid crystal polymer (LCP), but the present disclosure is not limited thereto.

The body 310 may be formed in the structure of a single or multi layered substrate, or be formed through injection molding, but the present disclosure is not limited thereto.

The cavity 315 has an opening in the upper part 312 of the body 310. The side surface of the cavity 315 may be inclined outward from the bottom surface of the body 310, and reflects incident light to the opening.

The reflective layer 314 is disposed on the side surface of the cavity 315 to reflect light from the light emitting device 320.

The first and second conductive members 332 and 334 may pass through both sides of the body 310, or be disposed on the bottom surface of the body 310 to function as outer electrodes. The first and second conductive members 332 and 334 may have the form of a lead frame, a metal thin film, or a circuit pattern of a printed circuit board.

The light emitting device 320 may be adhered to the first conductive member 332 through conductive adhesive, and be connected to the second conductive member 334 through the wire 322. The light emitting device 320 may be installed using a wire bonding method, a die bonding method, or a flip bonding method, which may be selected according to the type of a chip and the position of an electrode of the chip.

The light emitting device 320 is the vertical light emitting device 100B illustrated in FIG. 8, and the conductive support member 270 is connected to the first conductive member 332, and the second electrode 280 is connected to the wire 322.

The resin 325 may be disposed within the cavity 315, and include at least one type of phosphor. The phosphor may include a yellow phosphor, or include a yellow phosphor and a red phosphor.

The light emitting device according to the above embodiments may function as a lighting system such as a backlight unit, an indicating device, a lamp, and a road lamp.

Hereinafter, an application according to an embodiment will be described with reference to FIGS. 11 and 12.

Figure 11:
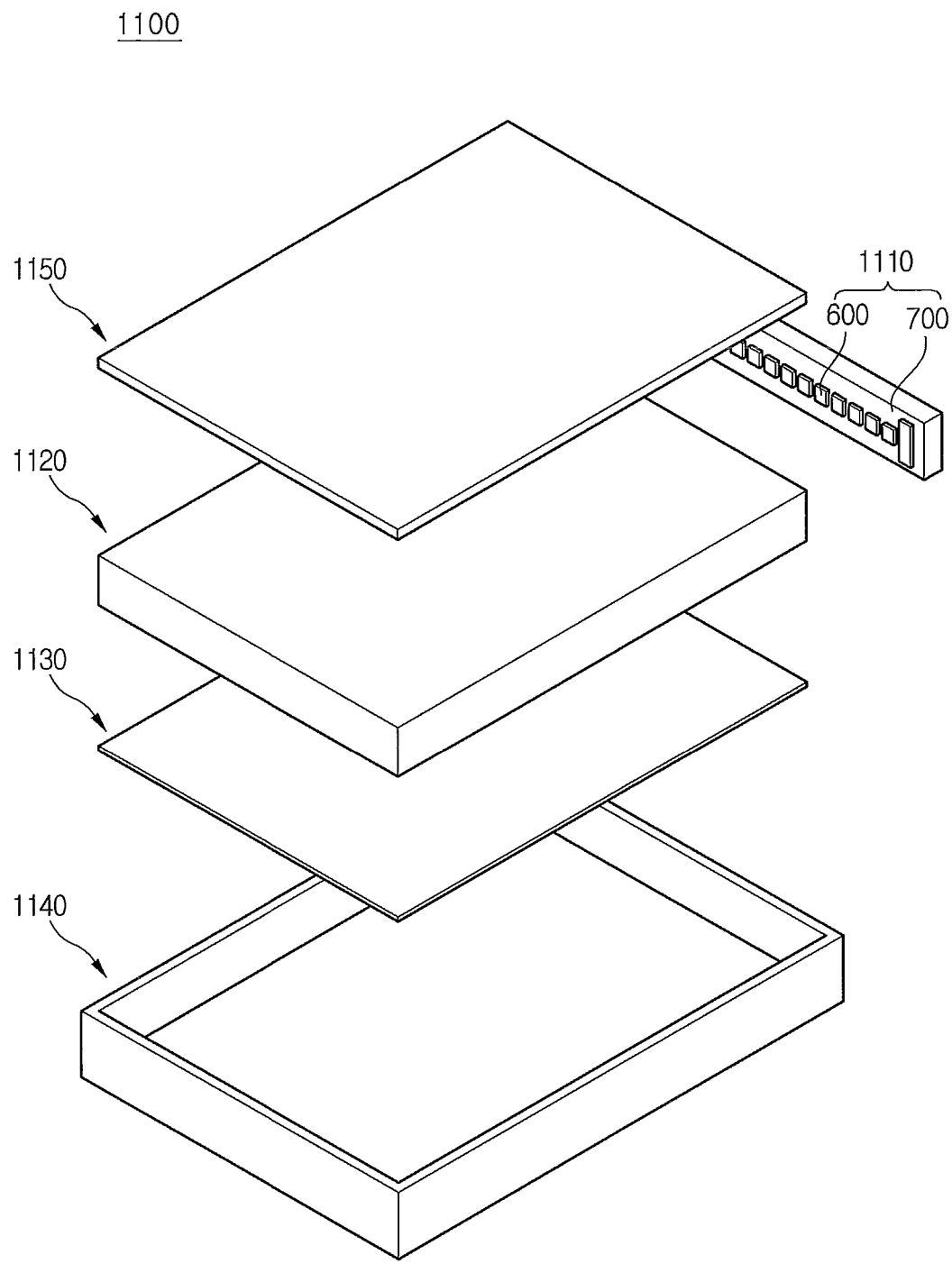
FIG. 11 is a perspective view illustrating a backlight unit including a light emitting device according to an embodiment.

FIG. 11 is a perspective view illustrating a backlight unit including a light emitting device according to an embodiment.

A backlight unit 1100 of FIG. 11 is just an example of a lighting system, and thus, the present disclosure is not limited thereto.

Referring to FIG. 11, the backlight unit 1100 may include a bottom cover 1140, a light guide member 1120 disposed within the bottom cover 1140, and a light emitting module 1110 on at least one surface or lower surface of the light guide member 1120. A reflective sheet 1130 may be disposed below the light guide member 1120.

The bottom cover 1140 may have a box shape with an open upper surface to receive the light guide member 1120, the light emitting module 1110, and the reflective sheet 1130, and be formed of metal or resin, but the present disclosure is not limited thereto.

The light emitting module 1110 may include a plurality of light emitting device packages 600 installed on a substrate 700. The light emitting device packages 600 provide light to the light guide member 1120.

The light emitting module 1110 may be disposed on at least one inner surface of the bottom cover 1140 to provide light to at least one surface the light guide member 1120.

However, the light emitting module 1110 may be disposed below the light guide member 1120 within the bottom cover 1140 to provide light to the bottom surface of the light guide member 1120. That is, the position of the light emitting module 1110 may be changed in various ways according to a design.

The light guide member 1120 may be disposed within the bottom cover 1140. The light guide member 1120 may receive light from the light emitting module 1110 and form a surface light source, and then, guide the surface light source to a display panel (not shown).

For example, the light guide member 1120 may be a light guide panel (LGP). For example, the light guide panel may be formed of one of acrylic resin such as polymethyl metaacrylate (PMMA), polyethylene terephthalate (PET), cycloolefin copolymer (COC), poly carbonate (PC), and polyethylene naphthalate resin.

An optical sheet 1150 may be disposed on the upper side of the light guide member 1120.

For example, the optical sheet 1150 may include at least one of a spread sheet, a light collecting sheet, a brightness enhancement sheet, and a fluorescent sheet. For example, the optical sheet 1150 may be formed by stacking a spread sheet, a light collecting sheet, a brightness enhancement sheet, and a fluorescent sheet. In this case, the spread sheet uniformly spreads light emitted from the light emitting module 1110, and the light collecting sheet collects the spread light on a display panel (not shown). At this point, light emitted from the light collecting sheet is randomly polarized light. The brightness enhancement sheet may increase a polarization degree of light emitted from the light collecting sheet. For example, the light collecting sheet may be a horizontal and/or vertical prism sheet. For example, the brightness enhancement sheet may be a dual brightness enhancement film. The fluorescent sheet may be a light transmitting plate or film including a phosphor.

The reflective sheet 1130 may be disposed below the light guide member 1120. The reflective sheet 1130 may reflect light, emitted through the bottom surface of the light guide member 1120, to a light emitting surface of the light guide member 1120. The reflective sheet 1130 may be formed of resin having high reflectivity, such as PET, PC, and poly vinyl chloride, but the present disclosure is not limited thereto.

Figure 12:
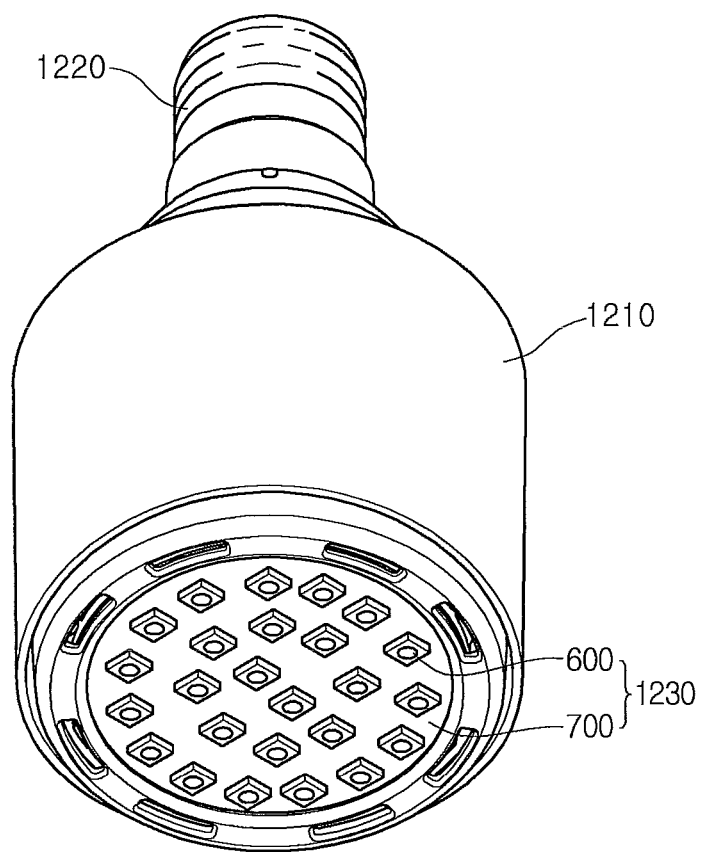
FIG. 12 is a perspective view illustrating a lighting system including a light emitting device according to an embodiment.

FIG. 12 is a perspective view illustrating a lighting system including a light emitting device according to an embodiment. However, a lighting system 1200 illustrated in FIG. 12 is just an example of a lighting system, and thus, the present disclosure is not limited thereto.

Referring to FIG. 12, the lighting system 1200 may include a case body 1210, a light emitting module 1230 disposed in the case body 1210, and a connection terminal 1220 disposed in the case body 1210 to receive power from an external power source.

The case body 1210 may be formed of a material having an improved heat dissipation characteristic. For example, the case body 1210 may be formed of a metal material or resin material.

The light emitting module 1230 may include a substrate 700 and at least one light emitting device package 600 mounted on the substrate 700.

A circuit pattern may be printed on an insulation material to form the substrate 700. For example, the substrate 700 may include a printed circuit board (PCB), a metal core PCB, a flexible PCB, or a ceramic PCB.

Also, the substrate 700 may be formed of a material that can effectively reflect light. A surface of the substrate 700 may be coated with a colored material, e.g., a white or silver-colored material by which light is effectively reflected.

At least one light emitting device package 600 may be mounted on the substrate 700.

Each light emitting device package 600 may include at least one light emitting device (light emitting diode (LED)). The light emitting device may include a colored light emitting device that emits red, green, blue, or white light, and an UV light emitting device that emits ultraviolet (UV) light.

The light emitting module 1230 may have various combinations of light emitting devices to obtain intended colors and brightness. For example, a white light emitting device, a red light emitting device, and a green light emitting device may be disposed in combination with each other to secure a high color rendering index (CRI). A fluorescent sheet may be disposed in the path of light emitted from the light emitting module 1230, and changes the wavelength of the light emitted from the light emitting module 1230. For example, when light emitted from the light emitting module 1230 has a blue wavelength band, the fluorescent sheet may include a yellow phosphor, and thus, the light emitted from the light emitting module 1230 is finally perceived as white light through the fluorescent sheet.

The connection terminal 1220 is electrically connected to the light emitting module 1230 to supply power thereto. Referring to FIG. 12, the connection terminal 1220 is screwed in the form of a socket into an outer power source, but the present disclosure is not limited thereto. For example, the connection terminal 1220 may be inserted in the form of a pin into an outer power source, or be connected to an outer power source through a wire.

In the above-described lighting system, at least one of the light guide member, the spread sheet, the light collecting sheet, the brightness enhancement sheet, and the fluorescent sheet is disposed in the path of light emitted from the light emitting module to obtain an intended optical effect.

The backlight unit 1100 and the lighting system 1200 illustrated in FIGS. 11 and 12 include the light emitting devices illustrated in FIGS. 1 to 8 in the light emitting modules 1110 and 1230 to obtain an improved optical efficiency.

Embodiments provide a light emitting device having improved reliability and a method of manufacturing the light emitting device.

Embodiments provide a light emitting device and a method of manufacturing the light emitting device, which minimizes optical loss.

Embodiments provide a light emitting device having a wide operation voltage range and a method of manufacturing the light emitting device.

Embodiments provide a light emitting device having a small amount of impurities, and a method of manufacturing the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive type semiconductor layer including an n-type dopant;
   an active layer on the first conductive type semiconductor layer;
   a roughness pattern disposed on the active layer, a first portion of the active layer exposed by the roughness pattern and a second portion of the active layer covered by the roughness pattern; and
   a second conductive type semiconductor layer including a p-type dopant on the roughness pattern and the active layer, the second conductive type semiconductor layer including a metal oxide semiconductor,
   wherein a first portion of the second conductive type semiconductor layer contacts an upper surface of the roughness pattern,
   wherein a second portion of the second conductive type semiconductor layer contacts the first portion of the active layer exposed by the roughness pattern,
   wherein an entire region of the roughness pattern is located at a position higher than an entire region of the active layer,
   wherein the active layer includes a nitride-based material different from the second conductive type semiconductor layer, and
   wherein the roughness pattern contacts a top surface of the active layer.

2. The light emitting device according to claim 1, wherein the metal oxide semiconductor is formed of a zinc oxide (ZnO).

3. The light emitting device according to claim 1, wherein the p-type dopant of the second conductive type semiconductor layer comprises at least one of magnesium (Mg), calcium (Ca), strontium (Sr), barium (Ba), and cadmium (Cd).

4. The light emitting device according to claim 1, wherein the second conductive type semiconductor layer comprises a concave-convex pattern.

5. The light emitting device according to claim 1, wherein the roughness pattern has a composition formula of $In_xAl_yGa_{1-x-y}N$, where $0 \leq x \leq 1$, $0 \leq y \leq 1$, and $0 \leq x+y \leq 1$.

6. The light emitting device according to claim 5, wherein the roughness pattern comprises a p-type dopant including at least one of magnesium (Mg), calcium (Ca), strontium (Sr), barium (Ba), and cadmium (Cd).

7. The light emitting device according to claim 1, wherein the active layer is formed by stacking a barrier layer and a well layer.

8. The light emitting device according to claim 7, wherein the barrier layer is provided in plurality,
   the active layer comprises the barrier layers, and
   a first barrier layer having a thickness ranging from about 150% to about 250% of a thickness of the other barrier layers is disposed on an uppermost part of the barrier layers.

9. The light emitting device according to claim 8, wherein an upper portion of the first barrier layer comprises a p-type dopant including at least one of magnesium (Mg), calcium (Ca), strontium (Sr), barium (Ba), and cadmium (Cd).

10. The light emitting device according to claim 9, wherein the upper portion of the first barrier layer including the p-type dopant has a thickness ranging from about 20% to about 30% of an entire thickness of the first barrier layer.

11. The light emitting device according to claim 1, wherein an electrode is disposed on the second conductive type semiconductor layer.

12. The light emitting device according to claim 1, further comprising a conductive support member on the second conductive type semiconductor layer and a reflective layer between the conductive support member and the second conductive type semiconductor layer.

13. The light emitting device according to claim 1, wherein the first portion of the second conductive type semiconductor layer is disposed on the second portion of the active layer.

14. The light emitting device according to claim 1, wherein a lowermost surface of the second conductive type semiconductor layer contacts an uppermost surface of the active layer, and
   wherein the second portion of the second conductive type semiconductor layer is disposed in porous regions of the roughness pattern.

15. The light emitting device according to claim 1, wherein the active layer includes a plurality of barrier layers and a plurality of well layers,
   wherein the plurality of barrier layer includes a first barrier layer having a thickness greater than a thickness of the other barrier layers,
   wherein the first barrier layer is disposed to be closer to the second conductive type semiconductor layer than to all of the plurality of well layers, and wherein the roughness pattern contacts a top surface of the first barrier layer.

16. The light emitting device according to claim 15, wherein the roughness pattern includes a nitride-based material different from the second conductive type semiconductor layer, and
wherein the roughness pattern has a thickness less than a thickness of the second conductive type semiconductor layer in a vertical direction.

17. The light emitting device according to claim 1, wherein the roughness pattern is formed of a p-type nitride-based semiconductor, and
wherein the roughness pattern is disposed between the active layer and the second conductive type semiconductor layer.

18. The light emitting device according to claim 17, wherein the roughness pattern has porous regions, and
wherein the porous regions are regularly distributed on an entire region of the top surface of the first barrier layer.

19. A light emitting device package comprising:
a body having a cavity;
a plurality of electrodes exposed within the cavity and separated from each other;
a light emitting device within the cavity, the light emitting device being connected to the electrode; and
a resin filling the cavity,
wherein the light emitting device includes a first conductive type semiconductor layer including an n-type dopant, an active layer on the first conductive type semiconductor layer, a roughness pattern on the active layer, and a second conductive type semiconductor layer including a p-type dopant on the roughness pattern and the active layer, the second conductive type semiconductor layer including a metal oxide semiconductor,
wherein a first portion of the active layer is exposed by the roughness pattern and a second portion of the active layer is covered by the roughness pattern,
wherein a first portion of the second conductive type semiconductor layer contacts an upper surface of the roughness pattern,
wherein a second portion of the second conductive type semiconductor layer contacts the first portion of the active layer exposed by the roughness pattern,
wherein an entire region of the roughness pattern is located at a higher position than that of an entire region of the active layer,
wherein the active layer includes a nitride-based material different from the second conductive type semiconductor layer,
wherein the roughness pattern contacts a top surface of the active layer, and
wherein the roughness pattern is disposed between the active layer and the second conductive type semiconductor layer.

20. The light emitting device according to claim 19, wherein the roughness pattern includes a p-type nitride-based semiconductor different from the second conductive type semiconductor layer.

* * * * *